US010527872B2

United States Patent
Kunishima et al.

(10) Patent No.: US 10,527,872 B2
(45) Date of Patent: Jan. 7, 2020

(54) SEMICONDUCTOR DEVICE

(71) Applicant: RENESAS ELECTRONICS CORPORATION, Tokyo (JP)

(72) Inventors: Hiroyuki Kunishima, Ibaraki (JP); Yasutaka Nakashiba, Ibaraki (JP); Masaru Wakabayashi, Ibaraki (JP); Shinichi Watanuki, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/798,780

(22) Filed: Oct. 31, 2017

(65) Prior Publication Data

US 2018/0052338 A1 Feb. 22, 2018

Related U.S. Application Data

(63) Continuation of application No. 15/152,117, filed on May 11, 2016, now Pat. No. 9,835,882.

(30) Foreign Application Priority Data

May 15, 2015 (JP) .................................. 2015-099864

(51) Int. Cl.
*G02B 6/26* (2006.01)
*G02F 1/025* (2006.01)
(Continued)

(52) U.S. Cl.
CPC ............. *G02F 1/025* (2013.01); *G02B 6/125* (2013.01); *G02B 6/132* (2013.01);
(Continued)

(58) Field of Classification Search
CPC ....... G02B 6/12007; G02B 6/26; G02F 1/225; G02F 1/0147; G02F 1/025; B82Y 20/00
See application file for complete search history.

(56) References Cited

U.S. PATENT DOCUMENTS

| 5,197,077 A | 3/1993 | Harding et al. |
| 9,391,227 B2 | 7/2016 | Sawayama et al. |

(Continued)

FOREIGN PATENT DOCUMENTS

| JP | 10-282351 A | 10/1998 |
| JP | 2012-027198 A | 2/2012 |
| JP | 2014-164243 A | 9/2014 |

OTHER PUBLICATIONS

Notice of Allowance issued in related U.S. Appl. No. 15/152,117, dated Aug. 23, 2017.
(Continued)

*Primary Examiner* — Jennifer Doan
(74) *Attorney, Agent, or Firm* — McDermott Will & Emery LLP

(57) ABSTRACT

A low reflectance film with a second reflectance (50% or lower) lower than a first reflectance is formed between an optical directional coupler and a first-layer wiring with the first reflectance. Thus, even when the first-layer wiring is formed above the optical directional coupler, the influence of the light reflected by the first-layer wiring on the optical signal propagating through the first optical waveguide and the second optical waveguide of the optical directional coupler can be reduced. Accordingly, the first-layer wiring can be arranged above the optical directional coupler, and the restriction on the layout of the first-layer wiring is relaxed.

13 Claims, 11 Drawing Sheets

(51) Int. Cl.
*H01L 23/532* (2006.01)
*G02B 6/125* (2006.01)
*G02B 6/132* (2006.01)
*G02B 6/28* (2006.01)
*G02B 6/12* (2006.01)

(52) U.S. Cl.
CPC .. *H01L 23/53214* (2013.01); *H01L 23/53228* (2013.01); *G02B 6/2852* (2013.01); *G02B 2006/12061* (2013.01); *G02B 2006/12142* (2013.01); *G02B 2006/12147* (2013.01); *G02F 2201/08* (2013.01)

(56) References Cited

U.S. PATENT DOCUMENTS

| | | | |
|---|---|---|---|
| 9,835,882 B2 * | 12/2017 | Kunishima | H01L 23/53214 |
| 2014/0241659 A1 | 8/2014 | Fukuda et al. | |
| 2016/0056115 A1 | 2/2016 | Kunishima et al. | |

OTHER PUBLICATIONS

Non-final Office Action issued in related U.S. Appl. No. 15/152,117, dated Jan. 26, 2017.
Japanese Office Action issued in corresponding Japanese Patent Application No. 2015-099864, dated Sep. 4, 2018, with English Translation.
Decision of Refusal issued in corresponding Japanese Patent Application No. 2015-099864, dated Apr. 2, 2019, with English translation.

* cited by examiner

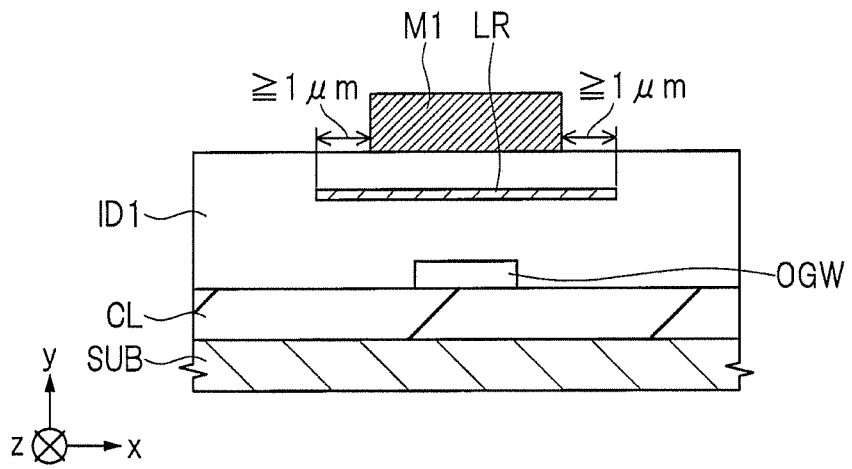
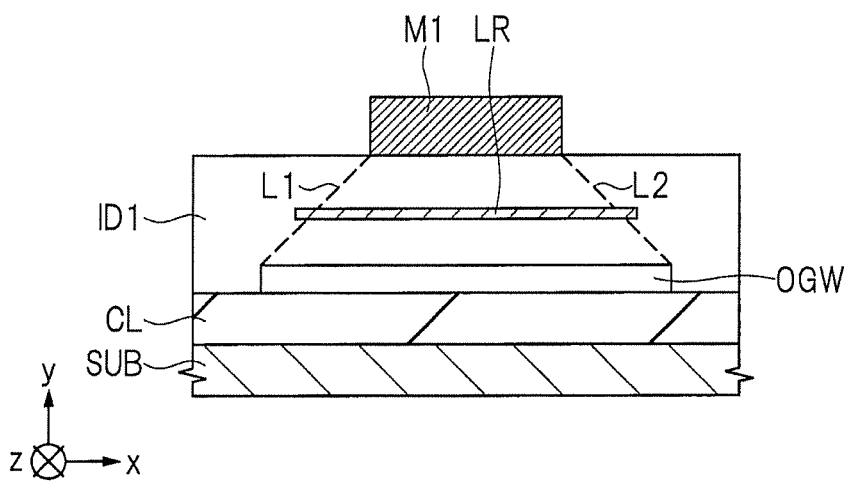
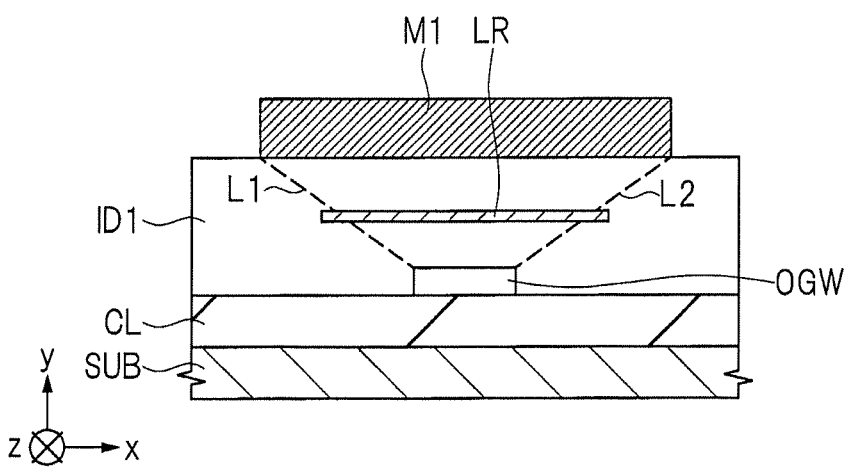

SEMICONDUCTOR DEVICE

CROSS-REFERENCE TO RELATED APPLICATION

The present application is a continuation of U.S. patent application Ser. No. 15/152,117 filed May 11, 2016, which claims priority from Japanese Patent Application No. 2015-099864 filed on May 15, 2015, the content of which is hereby incorporated by reference into this application.

TECHNICAL FIELD OF THE INVENTION

The present invention relates to a semiconductor device, and can be effectively applied to, for example, a semiconductor device having various optical devices in a semiconductor chip.

BACKGROUND OF THE INVENTION

Japanese Patent Application Laid-Open Publication No. 2012-027198 (Patent Document 1) describes an optical semiconductor device including an optical waveguide formed of a part of a semiconductor layer, a first impurity region which is formed in the semiconductor layer on one side of the optical waveguide and to which an impurity of a first conductivity type is introduced and a second impurity region which is formed in the semiconductor layer on the other side of the optical waveguide and to which an impurity of a second conductivity type opposite to the first conductivity type is introduced.

SUMMARY OF THE INVENTION

No electric wiring layer is formed right above an optical waveguide made of silicon (Si) in general. This is for the purpose of preventing the light (referred to also as Evanescent light or near-field light) which has leaked out when optical signals propagate through an optical waveguide from being reflected by the electric wiring layer located right above it and interfering with the optical signals propagating through the optical waveguide. For this reason, however, the layout of the electric wiring layer is restricted, and this makes it difficult to reduce the size of the semiconductor chip.

The other problems and novel characteristics of the present invention will be apparent from the description of the present specification and the accompanying drawings.

A semiconductor device according to an embodiment includes: a semiconductor substrate; an insulating layer formed on the semiconductor substrate; an optical waveguide made of a semiconductor layer formed on the insulating layer; an interlayer insulating film formed on the insulating layer so as to cover the optical waveguide; and a wiring with a first reflectance formed on the interlayer insulating film. Further, a low reflectance film with a second reflectance lower than the first reflectance is formed between the optical waveguide and the wiring.

According to the embodiment, it is possible to achieve the size reduction of the semiconductor chip.

BRIEF DESCRIPTIONS OF THE DRAWINGS

FIG. 2A is a cross-sectional view showing the principal part of a first arrangement example of a low reflectance film of the first embodiment;

FIG. 2B is a cross-sectional view showing the principal part of a second arrangement example of the low reflectance film of the first embodiment;

FIG. 2C is a cross-sectional view showing the principal part of a third arrangement example of the low reflectance film of the first embodiment;

DESCRIPTIONS OF THE PREFERRED EMBODIMENTS

Figure 1:
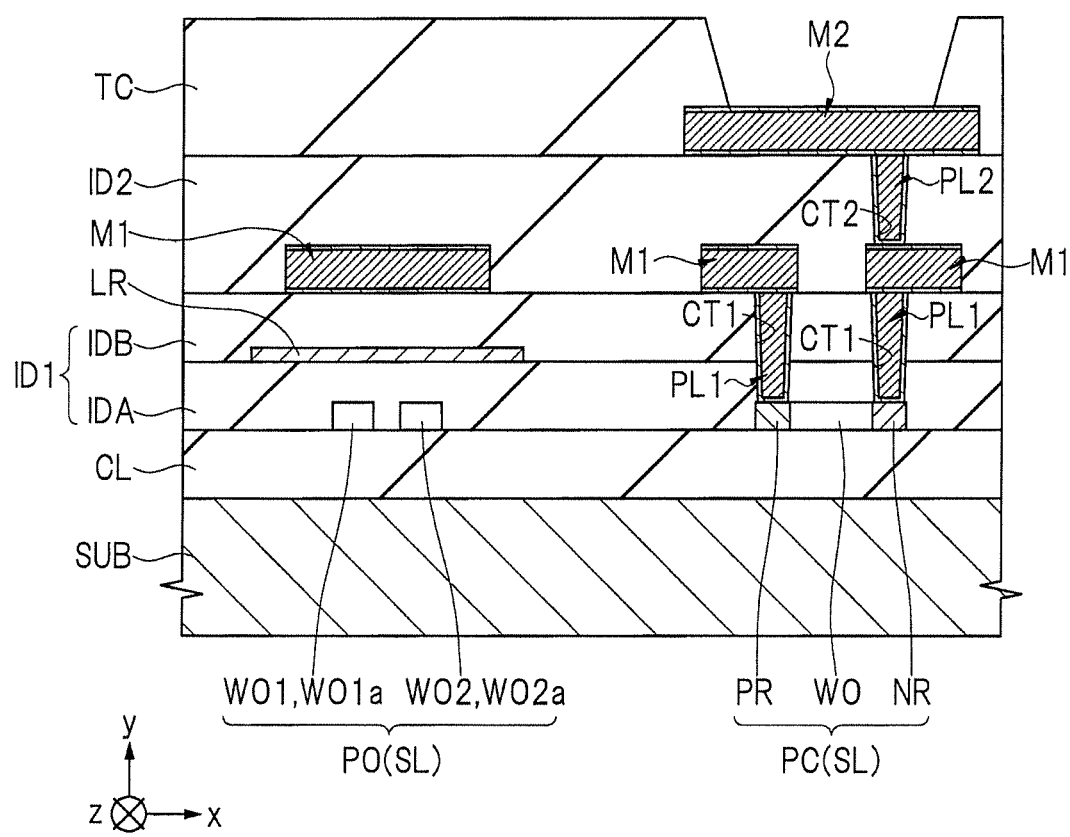
FIG. 1 is a cross-sectional view showing the principal part of a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Further, even when mentioning that constituent elements or the like are "made of A", "constituted of A", "have A" and "include A", elements other than A are of course not excluded except the case where it is particularly specified that A is the only element thereof. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

Further, components having the same function are denoted by the same reference characters throughout the drawings for describing the embodiments, and the repetitive description thereof will be omitted. Hereinafter, embodiments of the present invention will be described in detail with reference to the accompanying drawings.

(First Embodiment)

In recent years, the development of the technology to realize an optical communication module by fabricating an optical signal transmission line made of silicon (Si) and integrating various optical devices and electronic devices with using an optical circuit constituted of the optical signal transmission line as a platform, that is, the silicon photonics technology has been actively pursued.

The technology disclosed in the first embodiment is applied in particular to an optical device among various devices constituting a semiconductor device using the silicon photonics technology. For this reason, in the following description, a structure and a manufacturing method of an optical device integrated on an SOI (Silicon On Insulator) substrate will be described. In addition, in the following description, an optical directional coupler and an optical modulator are illustrated as examples of optical devices and a multilayer wiring with a two-layer structure is illustrated as an example, but the present invention is not limited to these.

<Structure of Semiconductor Device>

A structure of a semiconductor device of the first embodiment will be described with reference to FIG. 1 and FIG. 2A to FIG. 2C. FIG. 1 is a cross-sectional view showing the principal part of the semiconductor device of the first embodiment. FIG. 2A is a cross-sectional view showing the principal part of a first arrangement example of a low reflectance film of the first embodiment, FIG. 2B is a cross-sectional view showing the principal part of a second arrangement example of the low reflectance film of the first embodiment, and FIG. 2C is a cross-sectional view showing the principal part of a third arrangement example of the low reflectance film of the first embodiment.

1. Optical Modulator

As shown in FIG. 1, an optical modulator PC is constituted of a semiconductor layer (referred to also as SOI layer) SL made of silicon (Si) formed on a main surface of a semiconductor substrate SUB made of single crystal silicon (Si) with an insulating layer (referred to also as BOX layer or lower cladding layer) CL interposed therebetween. A thickness of the insulating layer CL is, for example, about 2 to 3 µm. A preferable range of a thickness of the semiconductor layer SL appears to be, for example, 100 nm to 300 nm (of course not limited to this range depending on other conditions), and a range around a center value of 200 nm appears to be the most preferable range. Here, the optical modulator PC with a pin structure will be described by way of example.

The optical modulator PC extends in a direction perpendicular to the plane of the paper (z direction shown in FIG. 1), and has an optical waveguide (referred to also as core layer) WO formed in a center part thereof when viewed in a lateral direction (x direction shown in FIG. 1) orthogonal to the direction perpendicular to the plane of the paper. Therefore, the optical signal introduced into the optical waveguide WO travels in the direction perpendicular to the plane of the paper. The optical waveguide WO is made of intrinsic semiconductor, that is, i-type semiconductor.

In the semiconductor layer SL on one side (left side in the drawing) of the optical waveguide WO, a p type impurity is introduced to form a p type semiconductor PR. The p type semiconductor PR is formed to be in parallel to the optical waveguide WO. Also, in the semiconductor layer SL on the other side (right side in the drawing) of the optical waveguide WO, an n type impurity is introduced to form an n type semiconductor NR. The n type semiconductor NR is formed to be in parallel to the optical waveguide WO. Namely, the semiconductor layer SL between the p type semiconductor PR and the n type semiconductor NR serves as the optical waveguide WO made of intrinsic semiconductor, so that the pin structure is formed. An electrode (first plug PL1 described later) is connected to each of the p type semiconductor PR and the n type semiconductor NR.

The carrier density in the optical waveguide WO made of intrinsic semiconductor is changed by the voltage applied to the electrode, and a refractive index in the region is changed. Consequently, an effective refractive index to the light propagating through the optical modulator PC is changed, so that an optical phase output from the optical modulator PC can be changed.

The optical modulator PC is covered with a first interlayer insulating film (referred to also as upper cladding layer) ID1, and a first-layer wiring M1 is formed on an upper surface of the first interlayer insulating film ID1. The first interlayer insulating film ID1 is made of, for example, silicon oxide ($SiO_2$) and a thickness thereof is, for example, about 2 to 3 µm. Connection holes (referred to also as contact hole) CT1 reaching the p type semiconductor PR and the n type semiconductor NR, respectively, are formed in the first interlayer insulating film ID1. A first plug (referred to also as buried electrode or buried contact) PL1 made of a material containing tungsten (W) as a main conductive material is formed together with barrier metal in the connection hole CT1. The barrier metal is provided for preventing the diffusion of the metal of the main conductive material constituting the first plug PL1, and is made of, for example, titanium (Ti) or titanium nitride (TiN). A thickness thereof is, for example, about 5 to 20 nm.

The first plug PL1 electrically connects the p type semiconductor PR and the first-layer wiring M1 and connects the n type semiconductor NR and the first-layer wiring M1. The first-layer wiring M1 is made of, for example, a main conductive material made of aluminum (Al), copper (Cu) or aluminum-copper alloy (Al—Cu alloy). A barrier metal may be fainted on a lower surface and an upper surface of the main conductive material. The barrier metal in this case is provided for preventing the diffusion of the metal of the main conductive material constituting the first-layer wiring M1, and is made of, for example, tantalum (Ta), titanium (Ti), tantalum nitride (TaN) or titanium nitride (TiN). A thickness thereof is, for example, about 5 to 20 nm.

The first-layer wiring M1 is covered with a second interlayer insulating film ID2, and a second-layer wiring M2 is formed on an upper surface of the second interlayer insulating film ID2. The second interlayer insulating film ID2 is made of, for example, silicon oxide ($SiO_2$) and a thickness thereof is, for example, about 2 to 3 µm. A connection hole (referred to also as via hole) CT2 reaching the first-layer wiring M1 is formed in the second interlayer insulating film ID2. A second plug (referred to also as buried electrode or buried contact) PL2 made of a material containing tungsten (W) as a main conductive material is formed together with barrier metal in the connection hole CT2. Like the first plug P1 described above, the barrier metal is provided for preventing the diffusion of the metal of the main conductive material constituting the second plug PL2, and is made of, for example, titanium (Ti) or titanium nitride (TiN). A thickness thereof is, for example, about 5 to 20 nm.

The second plug PL2 electrically connects the first-layer wiring M1 and the second-layer wiring M2. The second-layer wiring M2 is made of, for example, a main conductive material made of aluminum (Al), copper (Cu) or aluminum-copper alloy (Al—Cu alloy) like the first-layer wiring M1 described above. A barrier metal may be formed on a lower surface and an upper surface of the main conductive material. The barrier metal in this case is provided for preventing the diffusion of the metal of the main conductive material constituting the second-layer wiring M2, and is made of, for example, tantalum (Ta), titanium (Ti), tantalum nitride (TaN) or titanium nitride (TiN). A thickness thereof is, for example, about 5 to 20 nm.

The second-layer wiring M2 is covered with a protection film TC and the protection film PC is partially opened to expose an upper surface of the second-layer wiring M2.

2. Optical Directional Coupler

As shown in FIG. 1, an optical directional coupler PO is constituted of the semiconductor layer SL formed on the upper surface of the semiconductor substrate SUB with the insulating layer CL interposed therebetween.

The optical directional coupler PO includes a first optical waveguide (referred to also as optical transmission line or core layer) WO1 and a second optical waveguide (referred to also as optical transmission line or core layer) WO2 parallel to the first optical waveguide WO1, and they are provided separately from each other. In addition, the first optical waveguide WO1 and the second optical waveguide WO2 extend in the direction perpendicular to the plane of the paper (z direction shown in FIG. 1). Therefore, the optical signal introduced into the first optical waveguide WO1 and the second optical waveguide WO2 travels in the direction perpendicular to the plane of the paper.

Also, the first optical waveguide WO1 and the second optical waveguide WO2 have an optical coupling region in which they are bent at their approximately central parts and come close to each other for a predetermined length (coupling length) when seen in a plan view. More specifically, a first optical coupling portion WO1a of the first optical waveguide WO1 and a second optical coupling portion WO2a of the second optical waveguide WO2 are provided in this optical coupling region. Further, the optical directional coupler PO is covered with the first interlayer insulating film ID1.

An optical field distribution of the light traveling through the first optical waveguide WO1 corresponding to one of the pair of optical waveguides described above spreads to the second optical waveguide WO2 corresponding to the other of the pair of optical waveguides adjacent via the first interlayer insulating film ID1 Therefore, when the light traveling through the first optical waveguide WO1 reaches a start end of the first optical coupling portion WO1a, an even symmetric mode and an odd symmetric mode having an equal field amplitude are excited in phase in the second optical waveguide WO2. As these two modes propagate through the optical coupling region, a phase difference occurs between the two modes, and the light transfers from the first optical waveguide WO1 to the second optical waveguide WO2 when the propagation distance at which the phase difference becomes π (that is, coupling length of the optical coupling region) is reached.

Therefore, the desired optical directional coupler PO can be configured by selecting the distance between the first optical coupling portion WO1a and the second optical coupling portion WO2a, the coupling length and the refractive index difference (difference between the refractive index of the first optical waveguide WO1 and the second optical waveguide WO2 and the refractive index of the first interlayer insulating film ID1) in the optical coupling region.

In addition, the first-layer wiring M1 is formed on the upper surface of the first interlayer insulating film ID1, and the first-layer wiring M1 is covered with the second interlayer insulating film ID2 and the protection film TC.

Here, the first interlayer insulating film ID1 is constituted of a lower-layer insulating film IDA and an upper-layer insulating film IDB, and a low reflectance film LR is formed above the optical directional coupler PO and between the lower-layer insulating film IDA and the upper-layer insulating film IDB.

The low reflectance film LR is made of a low reflectance material with a reflectance of 50% or lower, for example, tungsten (W), tantalum (Ta), titanium (Ti) or titanium nitride (TiN). A preferable range of the thickness of the low reflectance film LR appears to be, for example, 100 nm to 500 nm (of course not limited to this range depending on other conditions), and a range around a center value of 300 nm appears to be the most preferable range.

Incidentally, no electric wiring layer is formed above the optical waveguide as described in the Patent Document 1 in general. This is for the purpose of preventing the light which has leaked out when optical signals propagate through an optical waveguide from being reflected by the electric wiring layer located right above it and interfering with the optical signals propagating through the optical waveguide. In general, the electric wiring layer is mainly made of a low resistance conductive material such as aluminum (Al), copper (Cu) or the like in order to reduce the electric resistance thereof, and the conductive material like this has a high reflectance of about 95%. Therefore, when the electric wiring layer is formed above the optical waveguide, the light which has leaked from the optical waveguide is almost entirely reflected by the electric wiring layer and interferes with the optical signal propagating in the optical waveguide. In addition, the electric wiring layer is formed apart from the optical waveguide more than necessary in consideration of the process margin and the like. Accordingly, the layout of the electric wiring layer is restricted, and this makes it difficult to reduce the size of the semiconductor chip.

However, in the first embodiment, the low reflectance film LR with the reflectance of 50% or lower is arranged just below the first-layer wiring M1 and between the first and second optical waveguides WO1 and WO2 of the optical directional coupler PO and the first-layer wiring M1 so as to be apart from the first-layer wiring M1. Thus, even when the light leaks during the propagation of the optical signal through the first and second optical waveguides WO1 and WO2 of the optical directional coupler PO, the leaked light is less likely to reach the first-layer wiring M1 located above the first and second optical waveguides WO1 and WO2 of the optical directional coupler PO, and the reflection of the light from the first-layer wiring M1 can be suppressed. Also, since the reflectance of the low reflectance film LR is lower than that of the first-layer wiring M1 and is, for example, 50% or lower, the light which has leaked from the first and second optical waveguides WO1 and WO2 of the optical directional coupler PO is less likely to be reflected by the low reflectance film LR, and the interference with the optical signal propagating through the first and second optical waveguides WO1 and WO2 of the optical directional coupler PO is also reduced.

Accordingly, the first-layer wiring M1 can be arranged above the first and second optical waveguides WO1 and WO2 of the optical directional coupler PO, and the restriction on the layout of the first-layer wiring M1 is relaxed and the size of the semiconductor chip can be reduced.

Note that, in order to obtain the structure in which the light which has leaked from the first and second optical waveguides WO1 and WO2 of the optical directional coupler PO is less likely to reach the first-layer wiring M1, it is desired that the low reflectance film LR is formed so as to enclose the first-layer wiring M1 when seen in a plan view.

As shown in FIG. 2A, for example, in an x direction orthogonal to a direction in which an optical signal travels (z direction) on the main surface of the semiconductor substrate SUB, a width of the low reflectance film LR in the x direction is set so that one end of the low reflectance film LR is located on an outer side relative to one end of the first-layer wiring M1 on the same side by 1 µm or more and the other end of the low reflectance film LR is located on an outer side relative to the other end of the first-layer wiring M1 on the same side by 1 µm or more.

Alternatively, as shown in FIG. 2B, for example, in a cross section including the x direction and a y direction orthogonal to the direction in which an optical signal travels (z direction), a first line L1 connecting one end of a lower surface of the first-layer wiring M1 (left-side end) and one end of an upper surface of an optical waveguide OGW (left-side end) is acquired. Similarly, a second line L2 connecting the other end of the lower surface of the first-layer wiring M1 (right-side end) and the other end of the upper surface of the optical waveguide OGW (right-side end) is acquired. Then, the width of the low reflectance film LR in the x direction is set so that the one end of the low reflectance film LR is located on the outer side relative to the first line L1 and the other end of the low reflectance film LR is located on the outer side relative to the second line L2.

However, it is not essential to form the low reflectance film LR so as to enclose the first-layer wiring M1 when seen in a plan view. As shown in FIG. 2C, for example, when the width of the first-layer wiring M1 in the x direction is much larger than a width of the optical waveguide OGW in the x direction, a first line L1 connecting one end of a lower surface of the first-layer wiring M1 (left-side end) and one end of an upper surface of the optical waveguide OGW (left-side end) is acquired in the cross section including the x direction and the y direction orthogonal to the direction in which an optical signal travels (z direction), Similarly, a second line L2 connecting the other end of the lower surface of the first-layer wiring M1 (right-side end) and the other end of the upper surface of the optical waveguide OGW (right-side end) is acquired. Then, the width of the low reflectance film LR in the x direction is set so that the one end of the low reflectance film LR is located on the outer side relative to the first line L1 and the other end of the low reflectance film LR is located on the outer side relative to the second line L2.

In addition, the low reflectance film LR is desirably fixed to a reference potential. However, the low reflectance film LR may be used as an electric wiring layer electrically connected to other electric wiring layers such as the first-layer wiring M1 and the second-layer wiring M2, or may be used as an electric wiring layer independent of other electric wiring layers such as the first-layer wiring M1 and the second-layer wiring M2.

<Manufacturing Method of Semiconductor Device>

A manufacturing method of a semiconductor device of the first embodiment will be described in order of process with reference to FIG. 3 to FIG. 11. FIG. 3 to FIG. 11 are cross-sectional views each showing a principal part of a semiconductor device (optical directional coupler and optical modulator) in the manufacturing process of the first embodiment.

Figure 3:
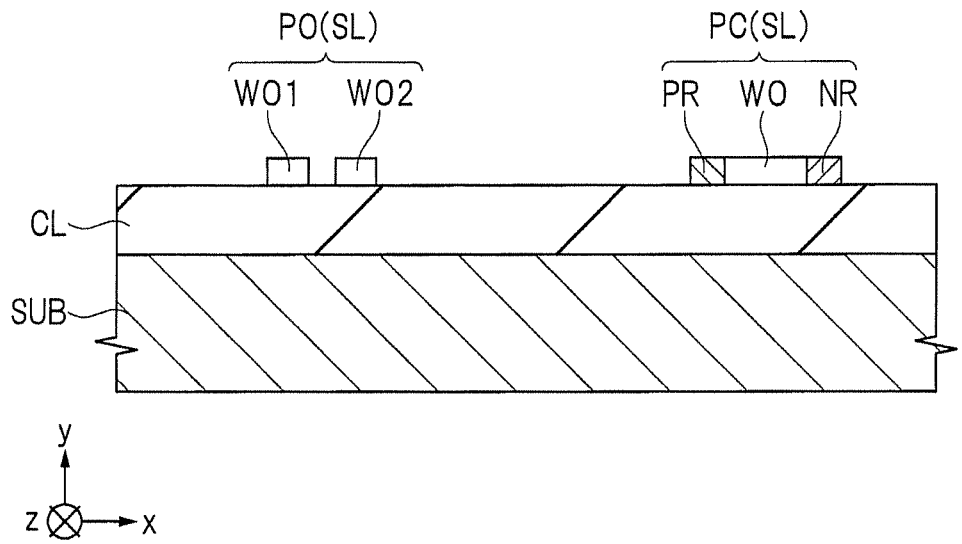
FIG. 3 is a cross-sectional view showing the principal part of the manufacturing process of the semiconductor device of the first embodiment.

First, as shown in FIG. 3, an SOI substrate (substrate with an approximately circular shape referred to as SOI wafer in this stage) made up of the semiconductor substrate SUB, the insulating layer CL formed on a main surface of the semiconductor substrate SUB, and the semiconductor layer SL formed on an upper surface of the insulating layer CL is prepared.

The semiconductor substrate SUB is a support substrate made of single crystal silicon (Si), the insulating layer CL is made of silicon oxide ($SiO_2$) and the semiconductor layer SL is made of silicon (Si). The thickness of the semiconductor substrate SUB is, for example, about 750 µm. The thickness of the insulating layer CL is, for example, about 2 to 3 µm. The thickness of the semiconductor layer SL is, for example, about 100 to 300 µm and preferably about 200 µm.

The SOI substrate can be formed by, for example, the SIMOX (Silicon Implanted Oxide) method, the lamination method or the Smart-Cut method. In the SIMOX method, for example, the SOI substrate is formed by implanting an oxygen (O) ion with high energy into a main surface of a semiconductor substrate made of silicon (Si) and forming an insulating film by bonding silicon (Si) and oxygen (O) in the subsequent heat treatment. In the lamination method, for example, the SOI substrate is formed by applying high heat and pressure to a semiconductor substrate made of silicon (Si) with an insulating film formed on an upper surface thereof and another semiconductor substrate made of silicon (Si) to adhere and laminate the substrates together and then polishing one of the semiconductor substrates into a thin film. Further, in the Smart-Cut method, for example, after an insulating film is formed on a main surface of a semiconductor substrate made of silicon (Si), the semiconductor substrate is subjected to hydrogen ion implantation and joined to another semiconductor substrate made of silicon (Si). Thereafter, a heat treatment is performed to peel off one of the semiconductor substrates by the use of the hydrogen embrittlement phenomenon, thereby forming the SOI substrate.

Next, the semiconductor layer SL is processed by dry etching using a resist mask, thereby forming the semiconductor layer SL for the optical directional coupler PO and the semiconductor layer SL for the optical modulator PC. Subsequently, a predetermined impurity is introduced to the semiconductor layer SL for the optical directional coupler PO. Then, a p type impurity is introduced to a part of the semiconductor layer SL for the optical modulator PC (part in which a p type semiconductor PR is formed), and an n type impurity is introduced to another part thereof (part in which an n type semiconductor NR is formed).

Through the process described above, the optical directional coupler PO constituted of the first optical waveguide WO1 and the second optical waveguide WO2 is formed. Also, the optical modulator PC having the pin structure constituted of the optical waveguide WO, the p type semiconductor PR located on one side of the optical waveguide WO and the n type semiconductor NR located on the other side of the optical waveguide WO is formed.

Figure 4:
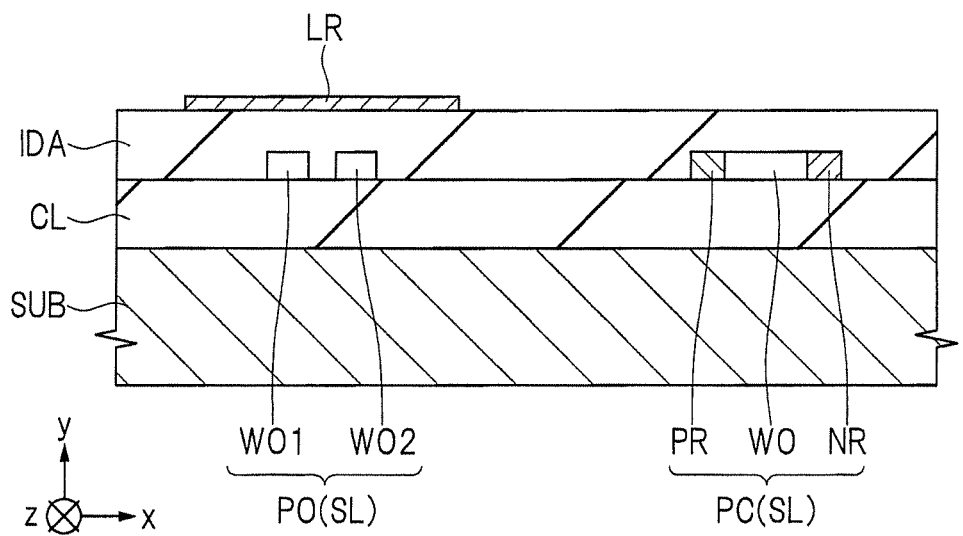
FIG. 4 is a cross-sectional view showing the principal part of the manufacturing process of the semiconductor device continued from FIG. 3.

Next, as shown in FIG. 4, the lower-layer insulating film IDA is deposited on an upper surface of the insulating layer CL so as to cover the optical directional coupler PO and the optical modulator PC. The lower-layer insulating film IDA is made of, for example, silicon oxide ($SiO_2$), and the thickness thereof is, for example, about 1 to 2 μm. Subsequently, an upper surface of the lower-layer insulating film IDA is planarized by, for example, the CMP (Chemical Mechanical Polishing) method.

Next, a low reflectance material with a reflectance of 50% or lower, for example, tungsten (W), tantalum (Ta), titanium (Ti) or titanium nitride (TiN) is deposited on the upper surface of the lower-layer insulating film IDA by, for example, the sputtering method, and the low reflectance material is processed by dry etching using a resist mask, thereby forming the low reflectance film LR. The thickness of the low reflectance film LR is, for example, about 100 to 500 nm, and preferably about 300 nm.

Figure 5:
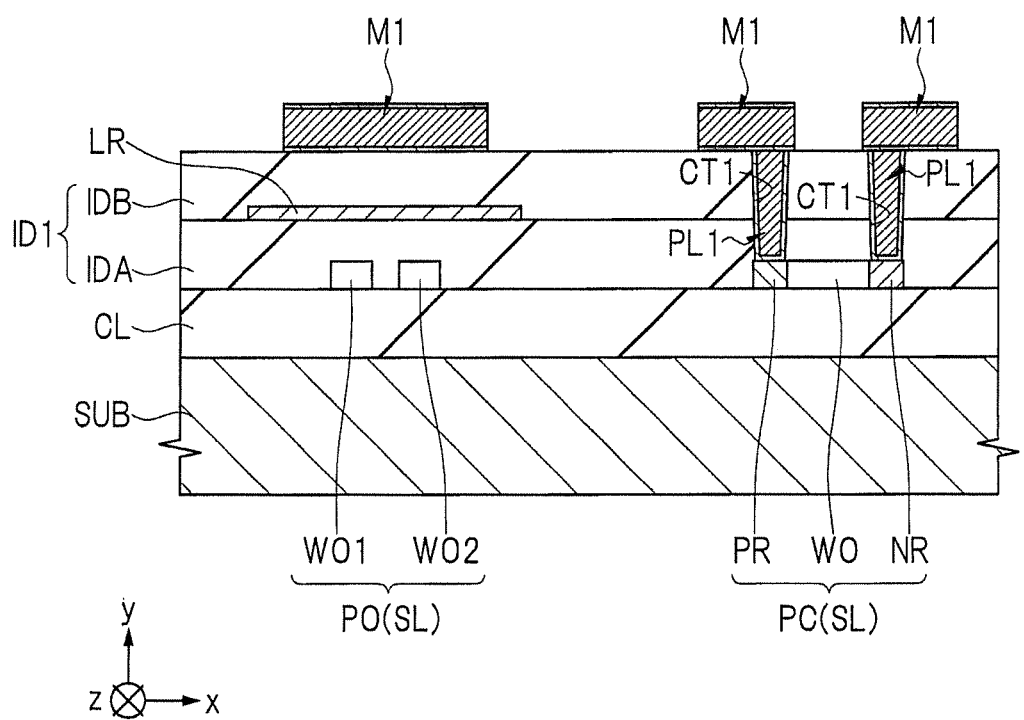
FIG. 5 is a cross-sectional view showing the principal part of the manufacturing process of the semiconductor device continued from FIG. 4.

Next, as shown in FIG. 5, the upper-layer insulating film IDB is deposited on the upper surface of the lower-layer insulating film IDA so as to cover the low reflectance film LR. The upper-layer insulating film IDB is made of, for example, silicon oxide ($SiO_2$) and the thickness thereof is, for example, 1 to 2 μm. Subsequently, an upper surface of the upper-layer insulating film IDB is planarized by, for example, the CMP method, thereby forming the first interlayer insulating film ID1 constituted of the lower-layer insulating film IDA and the upper-layer insulating film IDB.

Next, the connection holes CT1, which reach the p type semiconductor PR and the n type semiconductor NR of the optical modulator PC, respectively, are formed in the first interlayer insulating film ID1. Subsequently, a conductive film is buried via barrier metal in the connection holes CT1, thereby forming the first plugs PL1 made of the buried conductive film as a main conductive material. The main conductive material constituting the first plug PL1 is made of, for example, aluminum (Al) or tungsten (W), and the barrier metal is made of, for example, titanium (Ti) or titanium nitride (TiN).

Next, barrier metal, a metal film (main conductive material) and barrier metal are sequentially deposited on the upper surface of the first interlayer insulating film ID1 by, for example, the sputtering method, and a laminated film thereof is processed by the dry etching using a resist film, thereby forming the first-layer wiring M1. The main conductive material constituting the first-layer wiring M1 is made of, for example, aluminum (Al), and when barrier metal is further formed on the main conductive material, it is made of, for example, tantalum (Ta), titanium (Ti), tantalum nitride (TaN) or titanium nitride (TiN).

Figure 6:
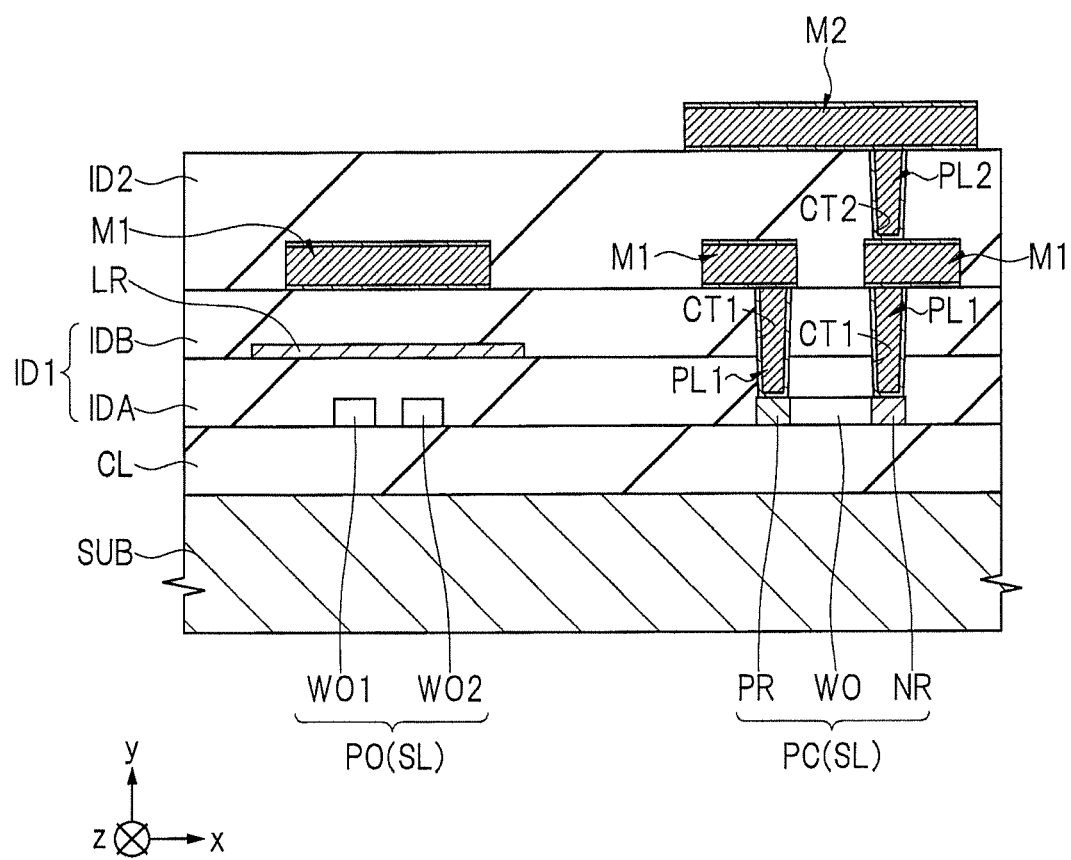
FIG. 6 is a cross-sectional view showing the principal part of the manufacturing process of the semiconductor device continued from FIG. 5.

Next, as shown in FIG. 6, the second interlayer insulating film ID2 is deposited on the upper surface of the first interlayer insulating film ID1 so as to cover the first-layer wiring M1. The second interlayer insulating film ID2 is made of silicon oxide ($SiO_2$) formed by, for example, the plasma CVD (Chemical Vapor Deposition) method, and the thickness thereof is, for example, about 2 to 3 μm.

Next, after an upper surface of the second interlayer insulating film ID2 is planarized by, for example, the CMP method, a connection hole CT2 reaching the first-layer wiring M1 is formed in the second interlayer insulating film ID2. Subsequently, a conductive film is buried via barrier metal in the connection hole CT2, thereby forming the second plug PL2 made of the buried conductive film as a main conductive material. The main conductive material constituting the second plug PL2 is made of, for example, aluminum (Al) or tungsten (W), and the barrier metal is made of, for example, titanium (Ti) or titanium nitride (TiN).

Next, barrier metal, a metal film (main conductive material) and barrier metal are sequentially deposited on the upper surface of the second interlayer insulating film ID2 by, for example, the sputtering method, and a laminated film thereof is processed by the dry etching using a resist film, thereby forming the second-layer wiring M2. The main conductive material constituting the second-layer wiring M2 is made of, for example, aluminum (Al), and when barrier metal is further formed on the main conductive material, it is made of, for example, tantalum (Ta), titanium (Ti), tantalum nitride (TaN) or titanium nitride (TiN).

Thereafter, as shown in FIG. 1, after the protection film TC is formed so as to cover the second-layer wiring M2, the protection film TC is processed to expose the upper surface of the second-layer wiring M2. In this manner, the semiconductor device of the first embodiment is nearly completed.

As described above, according to the first embodiment, even when the first-layer wiring M1 is formed above the optical directional coupler PO, since the low reflectance film LR is formed between the first-layer wiring M1 and the optical directional coupler PO so as to be apart from the first-layer wiring M1, it is possible to reduce the influence of the light reflected by the first-layer wiring M1 on the optical signal propagating through the first optical waveguide WO1 and the second optical waveguide WO2 of the optical directional coupler P0. Accordingly, the first-layer wiring M1 can be arranged above the optical directional coupler PO, and the restriction on the layout of the first-layer wiring M1 is relaxed and the size of the semiconductor chip can be reduced.

(Second Embodiment)

The second embodiment differs from the first embodiment described above in the arrangement of the low reflectance film LR. Namely, in the first embodiment described above, the first interlayer insulating film ID1 which covers the first-layer wiring M1 is constituted of the lower-layer insulating film IDA and the upper-layer insulating film IDB, and the low reflectance film LR is formed between the lower-layer insulating film IDA and the upper-layer insulating film IDB. In the second embodiment, however, the low reflectance film LR is formed between the first interlayer insulating film ID1 and the first-layer wiring M1 so as to be in contact with the first-layer wiring M1.

Since the semiconductor device of the second embodiment is almost the same as the semiconductor device of the first embodiment described above except for the arrangement of the low reflectance film LR, the difference will be mainly described below.

<Structure of Semiconductor Device>

Figure 7:
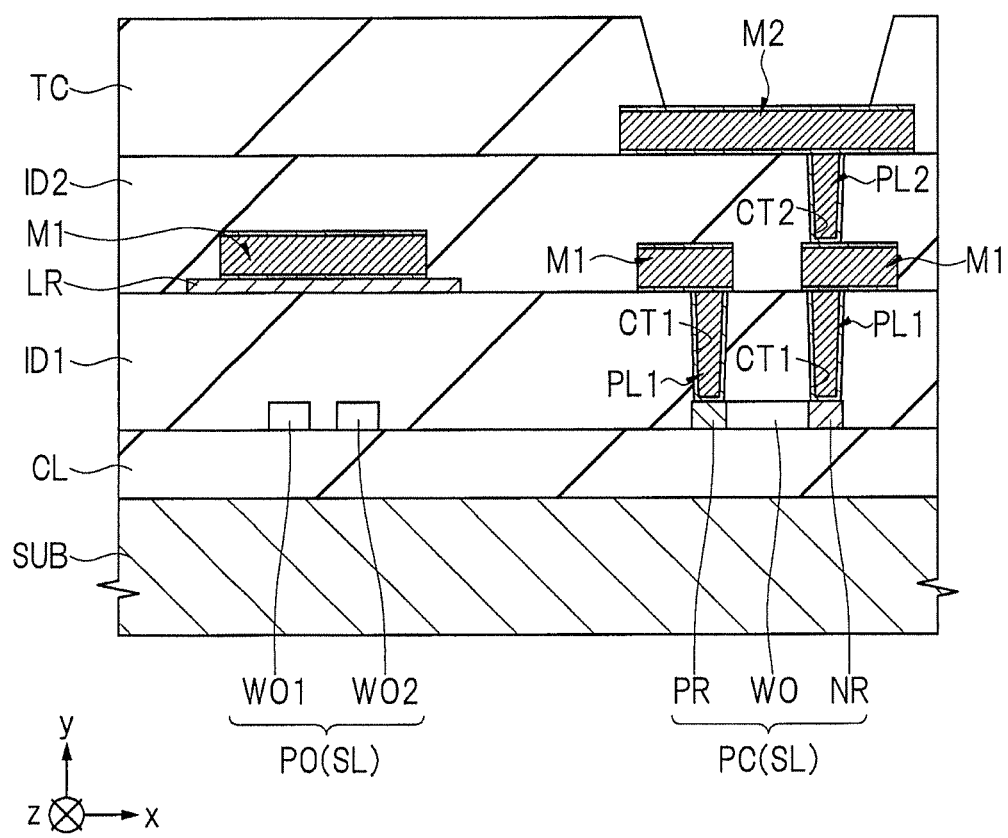
FIG. 7 is a cross-sectional view showing the principal part of a semiconductor device of the second embodiment.

The structure of the semiconductor device according to the second embodiment will be described with reference to FIG. 7. FIG. 7 is a cross-sectional view showing the principal part of the semiconductor device of the second embodiment.

As shown in FIG. 7, the SOI substrate made up of the semiconductor substrate SUB, the insulating layer CL formed on the main surface of the semiconductor substrate SUB, and the semiconductor layer SL formed on the upper surface of the insulating layer CL is used in the semiconductor device, and the semiconductor layer SL constitutes each of the optical directional coupler PO and the optical modulator PC like in the first embodiment described above. Further, the first-layer wiring M1 and the second-layer wiring M2 are formed, and the first-layer wiring M1 is formed also above the first optical waveguide WO1 and the second optical waveguide WO2 of the optical directional coupler PO via the first interlayer insulating film ID1. The thickness of the first interlayer insulating film ID1 is, for example, about 2 to 3 μm.

However, the low reflectance film LR is formed between the first interlayer insulating film ID1 which covers the optical directional coupler PO and the optical modulator PC and the first-layer wiring M1 so as to be in contact with the first-layer wiring M1 unlike in the first embodiment described above.

The low reflectance film LR is made of a low reflectance material with a reflectance of 50% or lower, for example, tungsten (W), tantalum (Ta), titanium (Ti) or titanium nitride (TiN). The thickness of the low reflectance film LR is, for example, about 100 nm to 500 nm, and preferably, about 300 nm.

In addition, the low reflectance film LR is formed so as to enclose the first-layer wiring M1 when seen in a plan view. For example, in the x direction orthogonal to a direction in which an optical signal travels (z direction) on the main surface of the semiconductor substrate SUB, the width of the low reflectance film LR in the x direction is set so that one end of the low reflectance film LR is located on an outer side relative to one end of the first-layer wiring M1 on the same side by 1 μm or more and the other end of the low reflectance film LR is located on an outer side relative to the other end of the first-layer wiring M1 on the same side by 1 μm or more.

In addition, the low reflectance film LR is desirably fixed to a reference potential. However, the low reflectance film LR may be used as an electric wiring layer electrically connected to other electric wiring layers such as the first-layer wiring M1 and the second-layer wiring M2, or may be used as an electric wiring layer independent of other electric wiring layers such as the first-layer wiring M1 and the second-layer wiring M2.

As described above, according to the second embodiment, even when the first-layer wiring M1 is formed above the optical directional coupler PO, since the low reflectance film LR is formed immediately below the first-layer wiring M1 so as to be in contact with the first-layer wiring M1, it is possible to reduce the influence of the light reflected by the first-layer wiring M1 on the optical signal propagating through the first optical waveguide WO1 and the second optical waveguide WO2 of the optical directional coupler PO. Accordingly, the first-layer wiring M1 can be arranged above the optical directional coupler PO, and the restriction on the layout of the first-layer wiring M1 is relaxed and the size of the semiconductor chip can be reduced.

Third Embodiment

The third embodiment differs from the first embodiment described above in the arrangement of the low reflectance film LR. Namely, in the first embodiment described above, the first interlayer insulating film ID1 which covers the first-layer wiring M1 is constituted of the lower-layer insulating film IDA and the upper-layer insulating film IDB, and the low reflectance film LR is formed between the lower-layer insulating film IDA and the upper-layer insulating film IDB. In the third embodiment, however, the low reflectance film LR is formed on a lower surface and a side surface of the first-layer wiring M1 so as to be in contact with the first-layer wiring M1.

Since the semiconductor device of the third embodiment is almost the same as the semiconductor device of the first embodiment described above except for the arrangement of the low reflectance film LR, the difference will be mainly described below.

<Structure of Semiconductor Device>

Figure 8:
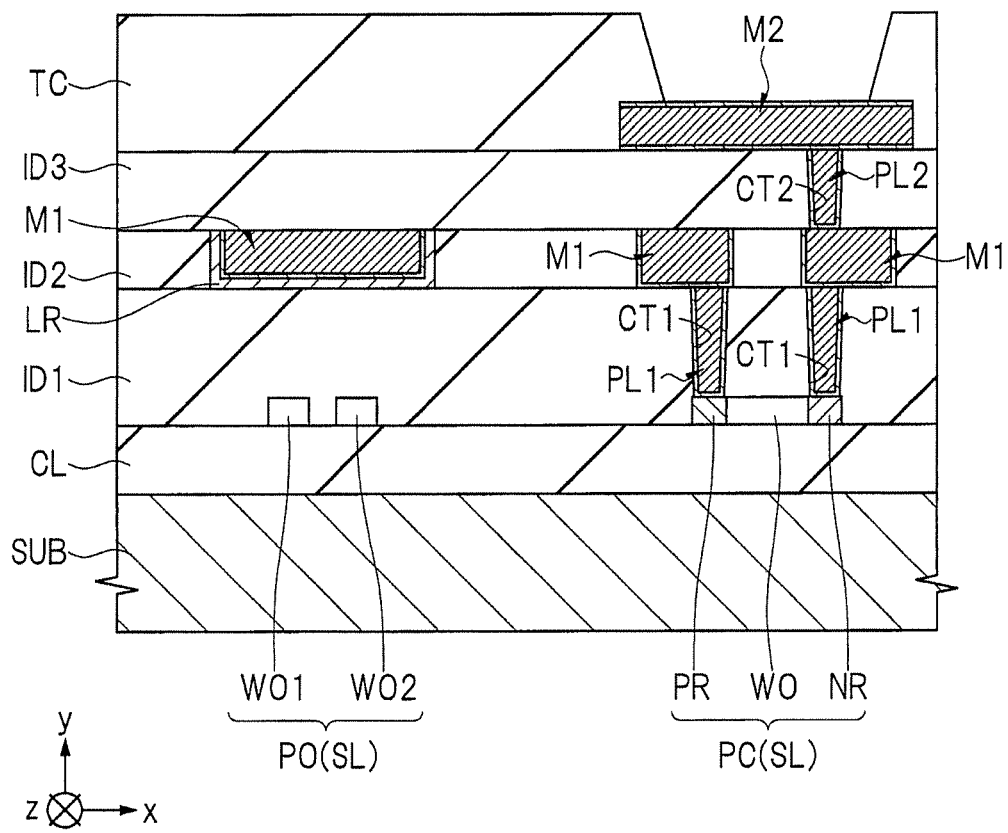
FIG. 8 is a cross-sectional view showing the principal part of a semiconductor device of the third embodiment.

The structure of the semiconductor device according to the third embodiment will be described with reference to FIG. 8. FIG. 8 is a cross-sectional view showing the principal part of the semiconductor device of the third embodiment.

As shown in FIG. 8, the SOI substrate made up of the semiconductor substrate SUB, the insulating layer CL formed on the main surface of the semiconductor substrate SUB, and the semiconductor layer SL formed on the upper surface of the insulating layer CL is used in the semiconductor device, and the semiconductor layer SL constitutes each of the optical directional coupler PO and the optical modulator PC like in the first embodiment described above. Further, the first-layer wiring M1 and the second-layer wiring M2 are formed, and the first-layer wiring M1 is formed also above the first optical waveguide WO1 and the second optical waveguide WO2 of the optical directional coupler PO via the first interlayer insulating film ID1.

However, the low reflectance film LR is formed on the lower surface and the side surface of the first-layer wiring M1 so as to be in contact with the first-layer wiring M1 unlike in the first embodiment described above. Also, the low reflectance film LR may be formed also on an upper surface of the first-layer wiring M1 in addition to the lower surface and the side surface.

The low reflectance film LR is made of a low reflectance material with a reflectance of 50% or lower, for example, tungsten (W), tantalum (Ta), titanium (Ti) or titanium nitride (TiN). The thickness of the low reflectance film LR is, for example, about 100 nm to 500 nm, and preferably, about 300 nm.

In addition, the low reflectance film LR is desirably fixed to a reference potential. However, the low reflectance film LR may be used as an electric wiring layer electrically connected to other electric wiring layers such as the first-layer wiring M1 and the second-layer wiring M2, or may be used as an electric wiring layer independent of other electric wiring layers such as the first-layer wiring M1 and the second-layer wiring M2.

<Manufacturing Method of Semiconductor Device>

A manufacturing method of the semiconductor device of the third embodiment will be described in order of process with reference to FIG. 9 to FIG. 12. FIG. 9 to FIG. 12 are cross-sectional views each showing a principal part of the semiconductor device in the manufacturing process of the third embodiment.

Figure 9:
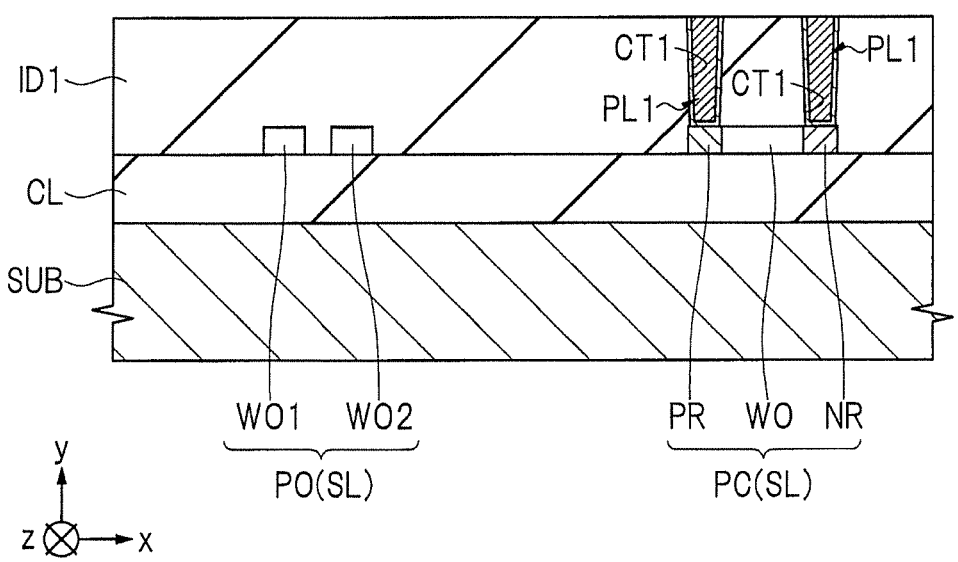
FIG. 9 is a cross-sectional view showing the principal part of the manufacturing process of the semiconductor device of the third embodiment.

As shown in FIG. 9, the SOI substrate is prepared and the semiconductor layer SL constituting the SOI substrate is processed in the same manner as that of the first embodiment, thereby forming the optical directional coupler PO constituted of the first optical waveguide WO1 and the second optical waveguide WO2 and the optical modulator PC having the pin structure constituted of the optical waveguide WO, the p type semiconductor PR located on one side of the optical waveguide WO and the n type semiconductor NR located on the other side of the optical waveguide WO.

Next, the first interlayer insulating film ID1 is formed on the upper surface of the insulating film CL so as to cover the optical directional coupler PO and the optical modulator PC. The first interlayer insulating film ID1 is made of, for example, silicon oxide ($SiO_2$) and the thickness thereof is, for example, about 2 to 3 μm.

Next, after the upper surface of the first interlayer insulating film ID1 is planarized by, for example, the CMP method, the connection holes CT1 are formed in the first interlayer insulating film ID1, and the first plugs PL1 are formed in the connection holes CT1.

Figure 10:
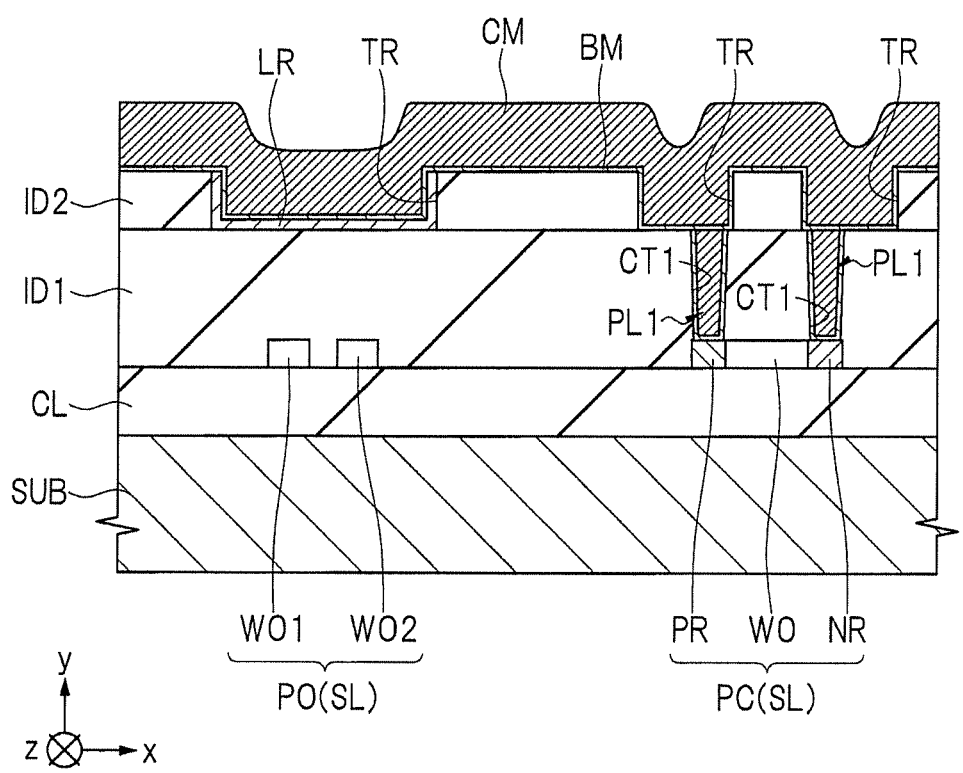
FIG. 10 is a cross-sectional view showing the principal part of the manufacturing process of the semiconductor device continued from FIG. 9.

Next, as shown in FIG. 10, the second interlayer insulating film ID2 is formed on upper surfaces of the first interlayer insulating film ID1 and the first plugs PL1. The second interlayer insulating film ID2 is made of, for example, silicon oxide ($SiO_2$) and the thickness thereof is, for example, about 1 µm.

Next, the second interlayer insulating film ID2 is processed by dry etching using a resist mask, thereby forming wiring trenches TR in predetermined regions.

Next, the low reflectance film LR made of a low reflectance material with a reflectance of 50% or lower, for example, tungsten (W), tantalum (Ta), titanium (Ti) or titanium nitride (TiN) is formed by, for example, the sputtering method on the upper surface of the second interlayer insulating film ID2 including side surfaces and bottom surfaces of the wiring trenches TR. The thickness of the low reflectance film LR is, for example, about 100 nm to 500 nm, and preferably, about 300 nm. Subsequently, the low reflectance film LR is removed except for the low reflectance film LR formed on the side surface and the bottom surface of the wiring trench TR formed above the optical directional coupler P0. Although the low reflectance film LR is formed only on the side surface and the bottom surface of the wiring trench TR formed above the optical directional coupler PO in the third embodiment, the low reflectance film LR may be formed on the side surfaces and the bottom surfaces of the wiring trenches TR in other regions.

Next, after the barrier metal BM is formed on the upper surface of the second interlayer insulating film ID2 including the side surfaces and the bottom surfaces of the wiring trenches TR, the seed layer of copper (Cu) is formed by, for example, the CVD method or the sputtering method, and a copper (Cu) plating film CM is further formed on the seed layer by the electroplating method. The copper (Cu) plating film CM fills the inside of the wiring trench TR. For example, when the barrier metal BM is further formed on the copper (Cu) plating film CM, it is made of, for example, tantalum (Ta), titanium (Ti), tantalum nitride (TaN) or titanium nitride (TiN), and the thickness thereof is, for example, about 5 to 20 nm.

Figure 11:
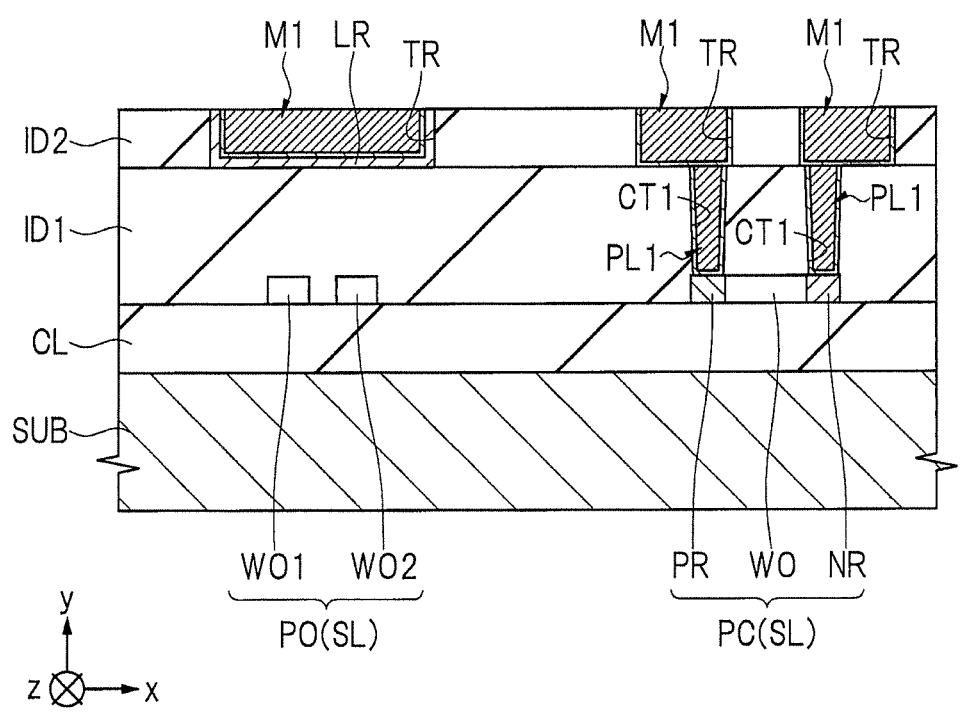
FIG. 11 is a cross-sectional view showing the principal part of the manufacturing process of the semiconductor device continued from FIG. 10.

Next, as shown in FIG. 11, the barrier metal BM and the copper (Cu) plating film CM in the region other than the wiring trenches TR are removed by, for example, the CMP method, thereby forming the first-layer wirings M1 made of a material containing copper (Cu) as a main conductive material.

Figure 12:
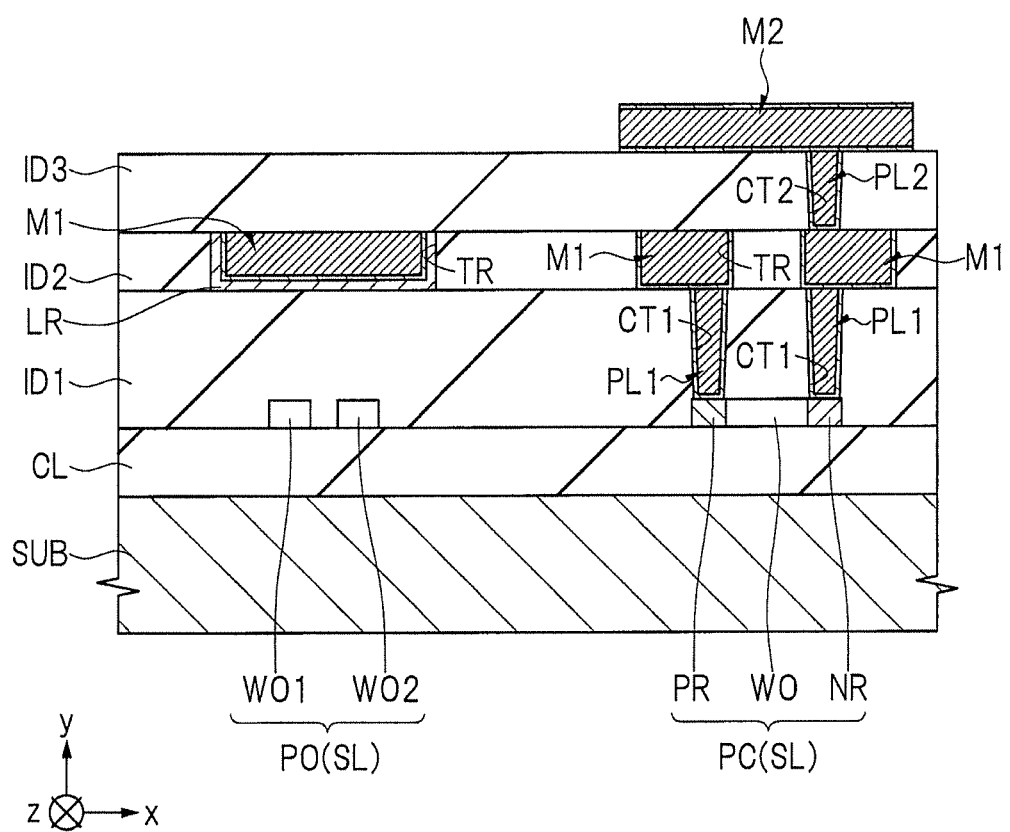
FIG. 12 is a cross-sectional view showing the principal part of the manufacturing process of the semiconductor device continued from FIG. 11.

Next, as shown in FIG. 12, a third interlayer insulating film ID3 is formed on the upper surfaces of the second interlayer insulating film ID2 and the first-layer wiring M1. The third interlayer insulating film ID3 is made of, for example, silicon oxide ($SiO_2$), and the thickness thereof is, for example, about 1 µm.

Next, after an upper surface of the third interlayer insulating film ID3 is planarized by, for example, the CMP method, a connection hole CT2 is formed in the third interlayer insulating film ID3 and the second plug PL2 is formed in the connection hole CT2. Subsequently, the second-layer wiring M2 electrically connected to the second plug PL2 is formed on the upper surface of the third interlayer insulating film ID3.

Thereafter, as shown in FIG. 8, after the protection film TC is formed so as to cover the second-layer wiring M2, the protection film TO is processed to expose the upper surface of the second-layer wiring M2. In this manner, the semiconductor device of the third embodiment is nearly completed.

As described above, according to the third embodiment, even when the first-layer wiring M1 is formed above the optical directional coupler PO, since the low reflectance film LR is formed on the lower surface and the side surface of the first-layer wiring M1 so as to be in contact with the first-layer wiring M1, it is possible to reduce the influence of the light reflected by the first-layer wiring M1 on the optical signal propagating through the first optical waveguide WO1 and the second optical waveguide WO2 of the optical directional coupler PO. Accordingly, the first-layer wiring M1 can be arranged above the optical directional coupler PO, and the restriction on the layout of the first-layer wiring M1 is relaxed and the size of the semiconductor chip can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device, comprising:
a semiconductor substrate;
a first insulating layer disposed on the semiconductor substrate;
an optical waveguide disposed on the first insulating layer;
a second insulating layer disposed on the first insulating layer such that the second insulating layer covers the optical waveguide;
a first layer wiring disposed on the second insulating layer and located right above the optical waveguide;
a barrier metal disposed on a lower surface of the first layer wiring; and
a film disposed between the second insulating layer and the barrier metal,
wherein the first layer wiring is comprised of metal,
wherein the second insulating layer is comprised of silicon oxide,
wherein the film is comprised of a compound of nitride, and
wherein a thickness of the second insulating layer is greater than a thickness of the film.

2. The semiconductor device according to claim 1, wherein the optical waveguide is comprised of silicon.

3. The semiconductor device according to claim 1, wherein the first insulating layer is comprised of silicon oxide.

4. The semiconductor device according to claim 3, wherein the first layer wiring is disposed on the film without intervening other insulating layers.

5. The semiconductor device according to claim 3, wherein the first layer wiring is disposed on the second insulating layer via a third insulating layer, and
wherein the film is covered with the third insulating layer.

6. The semiconductor device according to claim 1, wherein the first layer wiring has a first reflectance, and
wherein the film has a second reflectance lower than the first reflectance.

7. The semiconductor device according to claim 1, wherein the film is comprised of a compound of nitride with titanium.

8. The semiconductor device according to claim 1, wherein the barrier metal is comprised of tantalum, titanium, tantalum nitride or titanium nitride.

9. The semiconductor device according to claim 1, wherein the film is in direct contact with the barrier metal.

10. The semiconductor device according to claim 1, wherein an end of the film is located on an outer side relative to an end of the barrier metal in plan view.

11. The semiconductor device according to claim 1, wherein the film is spaced apart from the barrier metal.

12. The semiconductor device according to claim 1, wherein the film is spaced apart from the first layer wiring.

13. The semiconductor device according to claim 1, wherein there is no wiring between the optical waveguide and the first layer wiring.

* * * * *